United States Patent
Kaplan et al.

(10) Patent No.: US 9,437,387 B1
(45) Date of Patent: Sep. 6, 2016

(54) TAP BOX ASSEMBLY WITH SEPARATED ANNUNCIATOR

(71) Applicant: Amazon Technologies, Inc., Reno, NV (US)

(72) Inventors: Faran Harold Kaplan, Seattle, WA (US); Brock Robert Gardner, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 51 days.

(21) Appl. No.: 14/307,291

(22) Filed: Jun. 17, 2014

(51) Int. Cl.
| | |
|---|---|
| *G08B 21/00* | (2006.01) |
| *H01H 85/32* | (2006.01) |
| *H05K 7/14* | (2006.01) |
| *H02H 3/04* | (2006.01) |
| *H01H 85/30* | (2006.01) |

(52) U.S. Cl.
CPC ............ *H01H 85/32* (2013.01); *H01H 85/30* (2013.01); *H02H 3/04* (2013.01); *H02H 3/046* (2013.01); *H05K 7/1492* (2013.01)

(58) Field of Classification Search
CPC ...... H01H 85/32; H01H 71/46; H01H 71/04; H01H 85/30; H02H 3/046; H02H 3/04; H05K 7/1492
USPC ........ 340/638, 639, 651, 652, 657; 337/206, 337/4, 265; 361/626, 835; 439/215
See application file for complete search history.

(56) References Cited

U.S. PATENT DOCUMENTS

| | | | | | |
|---|---|---|---|---|---|
| 4,698,621 | A | * | 10/1987 | Masot ................. | G08B 21/185 200/308 |
| 5,053,637 | A | * | 10/1991 | Dillard ................. | H02G 3/285 174/486 |
| 8,310,373 | B2 | * | 11/2012 | Feight ................ | H04B 10/1141 324/500 |
| 2013/0016454 | A1 | * | 1/2013 | Sirignano ............... | H02B 3/10 361/602 |
| 2014/0293516 | A1 | * | 10/2014 | Swift ...................... | H02B 1/20 361/624 |

OTHER PUBLICATIONS

"Zenith Series DPB Distributed Power Busway", GE Critical Power, Feb. 2013, pp. 1-8.
"Overhead Distributed Power Busway for the Data Center", GE Critical Power, Sep. 2013, pp. 1-18.
"GE Zenith Series DPB Distributed Power Busway", May 19, 2014, pp. 1-5.

* cited by examiner

*Primary Examiner* — Anh V La
(74) *Attorney, Agent, or Firm* — Robert C. Kowert; Meyertons, Hood, Kivlin, Kowert & Goetzel, P.C.

(57) ABSTRACT

A tap box assembly with separated annunciator emits a visual signal from an annunciator separated from a tap box such that the visual signal can be viewed from a remote location. The tap box provides electrical power from a busway to one or more rack computer systems via a power cable. The visual signal indicates whether the tap box is in a normal or abnormal state. A tap box assembly with separated annunciator can be coupled to a busway that extends down an aisle at an elevated position. A tap box assembly with separated annunciator can couple to a busway that extends along an aisle in an underfloor space. Data center technicians can easily view the state of a plurality of tap boxes of an aisle from an end of the aisle based on the visual signals emitted from a plurality of annunciators coupled to a plurality of tap boxes and separated from the tap boxes by a separation distance.

21 Claims, 12 Drawing Sheets

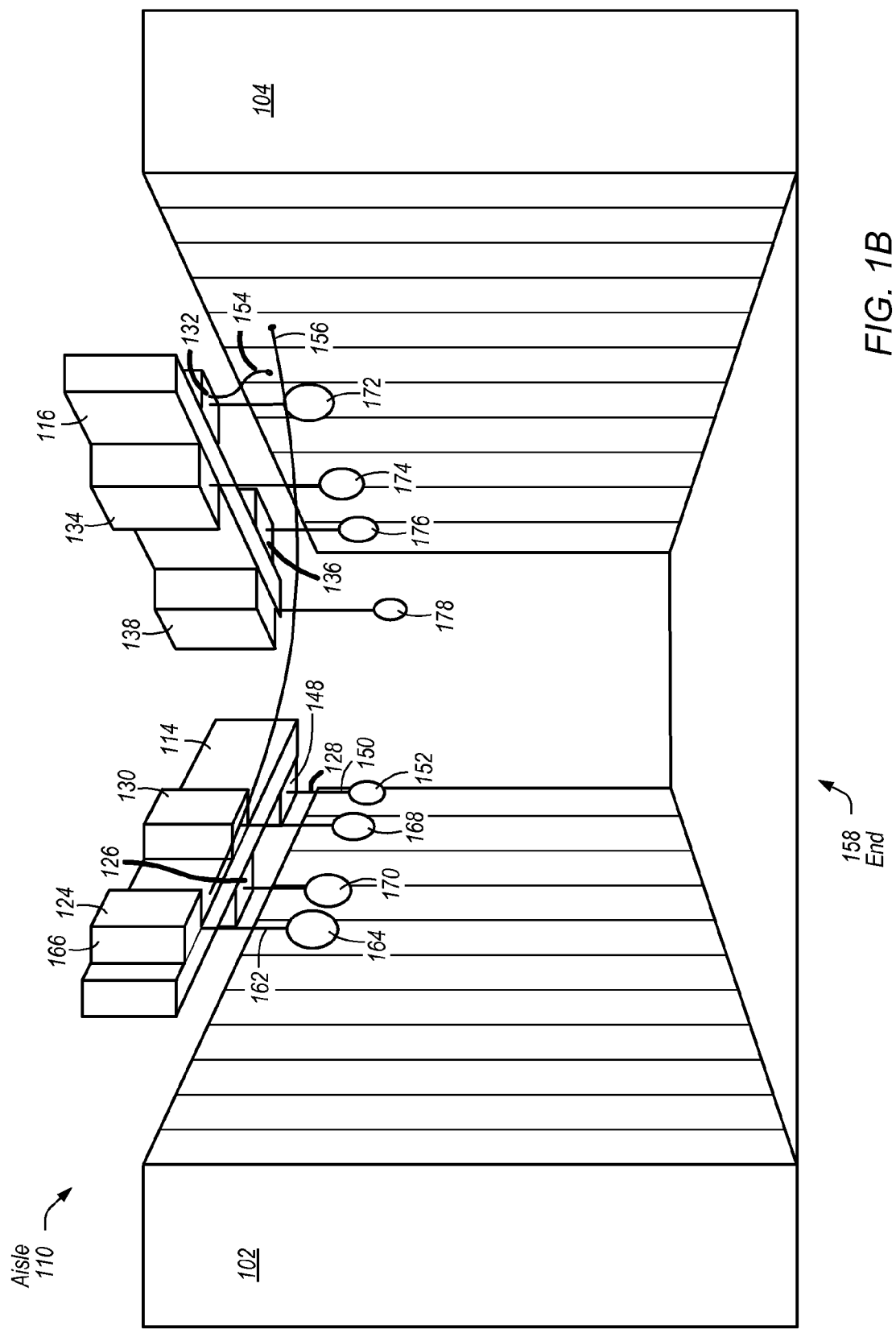

TAP BOX ASSEMBLY WITH SEPARATED ANNUNCIATOR

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many computing racks, which may include server racks. Each computing rack, in turn, may include many computer systems, servers, associated computer equipment, etc.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). A network of cabling, bus bars, tap boxes, power connectors, and power distribution units (PDUs), is used to deliver the power to numerous specific components in the facility. Circuit breakers mounted in tap boxes protect sets of components in the facility from potential damage caused by overload and short circuits.

Typically, one or more busways extend the length of an aisle of computing racks in a computer room. Tap boxes are coupled to a busway at separate locations along a length of the busway extending along the aisle of computing racks. Power connectors couple tap boxes to PDUs that distribute electrical power to one or more computing racks. An open or malfunctioning circuit breaker mounted in a tap box can cause computing racks receiving electrical power from one or more PDUs coupled to the specific tap box to lose power. Due to the interconnected nature of some data centers, a loss of one or more rack computing systems can affect the overall operation of the data center and impact the data center's ability to meet customer demands.

BRIEF DESCRIPTION OF THE DRAWINGS

FIG. 1B illustrates an aisle of rack computer systems coupled to busways via tap boxes with suspended annunciators, according to some embodiments.

Figure 1A:
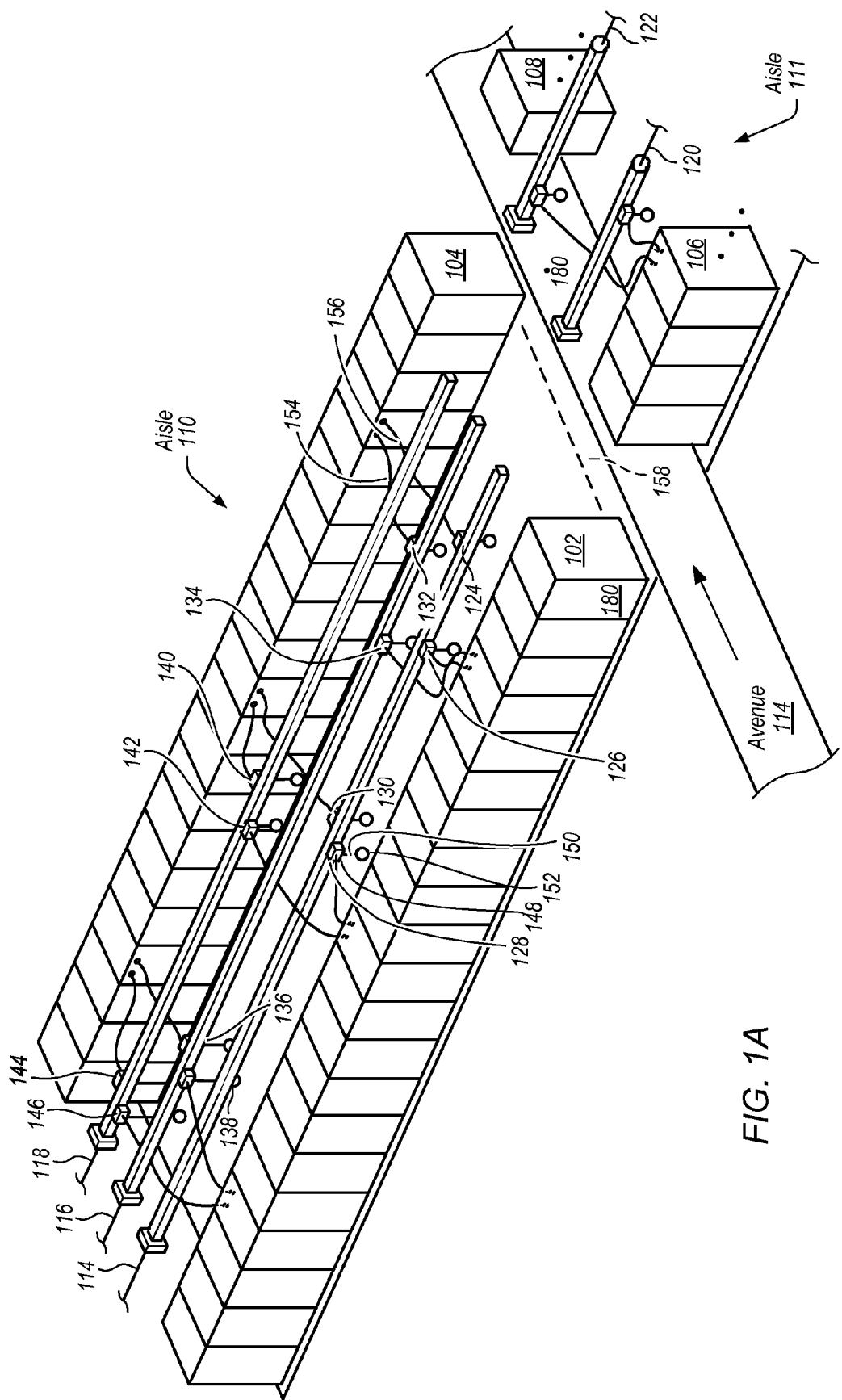
FIG. 1A illustrates a data center with rack computer systems coupled to busways via tap boxes with suspended annunciators, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a tap box assembly with separated annunciator, and systems and methods of employing a tap box assembly with separated annunciator are disclosed. According to some embodiments, a data center may include rows of rack computer systems extending on opposite sides of an aisle. A busway may extend at an elevated position along the aisle and distribute electrical power from a power source to one or more of the rack computer systems in the aisle via one or more tap box assemblies coupled to the busway and one or more power cables. The tap box assembly may include a suspended annunciator electrically coupled to the tap box housing and suspended at a particular position beneath the tap box. For example, a tap box assembly may couple to an overhead busway and include a light electrically coupled to the tap box housing that hangs below the tap box housing. The suspended annunciator may emit a visual signal indicating a state of the tap box housing at the particular position beneath the tap box housing to enable manual observation of the visual signal from a remote location, at an end of an aisle of computer systems. For example, the light electrically coupled to the tap box assembly may indicate a circuit breaker in the tap box is open or malfunctioning by illuminating a red light that is visible from an end of the aisle of computer systems. The view of the tap box housing may be obscured by wiring, cable trays, or other equipment in the data center, so that a person viewing the tap box assembly from the end of the aisle may not be able to see the tap box housing but can see the red light suspended a distance below the tap box housing indicating an open or malfunctioned circuit breaker.

According to some embodiments, a tap box assembly with separated annunciator includes a tap box that distributes electrical power from a busway coupled to the tap box to one or more rack computer systems. The tap box assembly with separated annunciator may include an annunciator directly coupled to the tap box via at least one electrical line that separates the annunciator from the tap box by a separation distance. For example, the tap box may be located in a space beneath a raised floor and couple to a busway that extends in the space beneath the raised floor. The annunciator may include a light mounted in a floor tile, so that the annunciator including a floor tile is mounted in the floor and the tap box is separated a distance below the floor tile in the space beneath the raised floor. A wire may electrically couple the annunciator that includes a floor tile to the tap box in the space beneath the raised floor.

According to some embodiments, a method for configuring a tap box assembly with separated annunciator includes receiving a tap box configured to couple to a busway distributing electrical power and distribute electrical power from the busway to one or more electrical loads via a power cable connection. Receiving an annunciator line with an annunciator on one end of the line and one or more electrical connectors on the opposite end of the line. Configuring the annunciator to emit a visual signal indicating a state of the tap box at a location separated from the tap box by a separation distance, where the separation distance enables remote observation of the state of the one or more circuit breakers from a remote location. For example, the annunciator line may include a light that hangs below the tap box mounted to an elevated busway. The light may flash to indicate an open breaker at the location below the tap box mounted to the elevated busway so that a data center technician can observe the light flashing from a remote location.

Configuring the annunciator to emit a visual signal indicating a state of the tap box at a location separated from the tap box includes electrically coupling the one or more electrical connectors of the annunciator line to a monitoring circuit of the tap box and coupling the tap box to the busway such that the visual indicator is manually observable from the remote location.

As used herein, "manual observation" refers to a person directly observing an indicator using his/her sense of sight.

As used herein, "remote location" relative to a tap box refers to a location in an aisle of computer systems, a location in a data center which is proximate to an end of an aisle of computer systems, etc. that is physically remote from a specific tap box mounted to a busway extending the length of the aisle.

As used herein, "tap box assembly" refers to a tap box housing including one or more circuit protection elements, an annunciator, and an annunciator line that couples the annunciator to one or more components of the tap box housing, wherein the tap box housing, the annunciator, and the annunciator line are coupled together to form the tap box assembly.

As used herein, "tap box housing" refers to a box unit that couples to a busway and includes one or more circuit protection elements coupled to one or more receptacles that are configured to distribute circuit-protected power via one or more power cables coupled to the receptacles. A tap box housing may include one or more circuits including a monitoring circuit and a remote monitoring system interface circuit.

FIG. 1A illustrates a data center with rack computer systems coupled to busways via tap box assemblies with suspended annunciators, according to some embodiments. Data center 100 comprises rows 102, 104, 106, and 108 of rack computer systems 180. Busways 114, 116, and 118 are in an elevated position extending the length of aisle 110 between rows 102 and 104. Busways 120 and 122 are in an elevated position and extend the length of aisle 111 between rows 106 and 108. Tap box assemblies 124, 126, 128, and 130 are coupled to busway 114. Tap box assemblies 132, 134, 136, and 138 are coupled to busway 116. Tap box assemblies 140, 142, 144, and 146 are coupled to busway 118. Busways 114, 116, 118, 120, and 122 distribute electrical power to rack computer systems in rows 102, 104, 106, and 108 via tap box assemblies 124, 126, 128, 130, 132, 134, 136, 138, 140, 142, 144, and 146. Tap box assemblies 124, 126, 128, 130, 132, 134, 136, 138, 140, 142, 144, and 146 comprise one or more circuit protection elements in their respective tap box housings and provide circuit-protected electrical power from busways 114, 116, 118, 120, and 122 to computer systems in rows 102, 104, 106, and 108. In some embodiments, tap box assemblies 124, 126, 128, 130, 132, 134, 136, 138, 140, 142, 144, and 146, comprise circuit breakers, fuses, or other like circuit protection elements.

In some embodiments, busways 114, 116, 118, 120, and 122 may extend in an underfloor space and tap box assemblies 124, 126, 128, 130, 132, 134, 136, 138, 140, 142, 144, and 146 may couple to the busways 114, 116, 118, 120, and 122 in the underfloor space.

Tap box assembly 128 comprises tap box housing 148, annunciator line 150, and annunciator 152. Tap box housing 148 is coupled to a right side of busway 114. In some embodiments, tap box housing 148 may couple to a left side of busway 114, a bottom side of busway 114, some combination thereof, or the like Annunciator line 150 is coupled to tap box housing 148 at one end and is coupled to annunciator 152 at an opposite end. Power cable 154 couples tap box assembly 132 to rack computer systems in row 104. Power cable 156 couples tap box assembly 124 to rack computer systems in row 104. Tap box assemblies 126, 128, 130, 134, 136, 138, 140, 142, 144, and 146 are electrically coupled to rack computer systems in rows 102 and 104 via power cables in a manner similar to tap box assemblies 124 and 132.

Annunciator line 150 suspends annunciator 152 in a position below tap box housing 128. Annunciator 152 comprises a light that emits a visual signal that can be seen from remote location 180 at end 158 of aisle 110 near avenue 114. In some embodiments, annunciator 152 emits a green light if the one or more circuit protection elements in tap box housing 148 are closed and functioning properly and emits a red light if one or more circuit protection elements in tap box housing 148 is open or malfunctioning. In some embodiments, annunciator 152 flashes a light to indicate a circuit protection element in tap box housing 148 is open or malfunctioning. In some embodiments, annunciator 152 emits a light when a circuit protection element in tap box housing 148 is open or malfunctioning and does not emit a light when the circuit protection elements in tap box housing 148 are closed and not malfunctioning. In some embodiments, other well-known methods are used to indicate an open or malfunctioned circuit protection element in tap box housing 148. Tap box assemblies 124, 126, 128, 130, 132, 134, 136, 138, 140, 142, 144, and 146 comprise a tap box housing 148, an annunciator line 150, and an annunciator 152 configured similar to tap box assembly 128.

Annunciator line 150 may be adjusted so that annunciator 152 is suspended in different positions below tap box housing 148 based on the location of tap box assembly 128 along aisle 110. In some embodiments, each successive tap box from end 158 of aisle 110 comprises an annunciator 152 suspended at a lower position than the preceding annunciator 152 so that all annunciators 152 in tap box assemblies 124, 126, 128, 130, 132, 134, 136, 138, 140, 142, 144, and 146 can be seen from end 158 of aisle 110. In some embodiments, tap box assemblies 124, 126, 128, 130, 132, and 134 which are proximate to end 158 of aisle 110 comprise annunciators 152 suspended at a certain position and tap box assemblies 136, 138, 140, 142, 144, and 146, which are distal from end 158 of aisle 110 comprise annunciators 152 suspended at a lower position than the annunciators of the tap box assemblies nearer end 158. In some embodiments, other configurations may be used to adjust the positions of annunciators 152 of tap box assemblies 124, 126, 128, 130, 132, 134, 136, 138, 140, 142, 144, and 146 so that the annunciators can be manually observed from end 158 of aisle 110. In some embodiments, the position of annunciator 152 of tap box assemblies 124, 126, 128, 130, 132, 134, 136, 138, 140, 142, 144, and 146 is not adjusted.

Annunciator line 150 includes one or more wires that electrically couple one or more lights of annunciator 152 to tap box housing 148. In some embodiments, annunciator line 150 may comprise a rigid member to maintain annunciator 152 in a fixed position. The rigid member may be a fiberglass rod, a plastic rod, or other like members capable of maintaining annunciator 152 in a fixed position below tap box housing 148. In some embodiments, annunciator line 150 may comprise a wire and the wire may suspend annunciator 152 below tap box housing 148 without a rigid member. In some embodiments, tap box housing 148 may couple to a busway extending in an underfloor space and annunciator 152 may comprise a floor tile mounted in a floor structure above tap box housing 148. Annunciator line 152 may couple tap box housing 148 to annunciator 152 mounted above tap box housing 148 in a floor structure.

An open or malfunctioning circuit protection element can cause a loss of power supply to one or more rack computer systems in rows 102, 104, 106, and 108. Data center 100 may be integrated so that multiple systems and multiple clients are supported by computers in racks 102, 104, 106, and 108 such that a loss of power to one or more racks in rows 102, 104, 106, or 108 causes a serious disruption of normal data center operations. In the event of an open or malfunctioning circuit protection element it may be imperative to quickly locate the open or malfunctioned circuit protection element so that a proper response can be formulated to limit the effect of the open or malfunctioned circuit protection element on other data center systems and clients.

Some data centers rely on indicators mounted directly on tap box housings 148 to identify a tap box containing an open or malfunctioned circuit breaker. The indicator mounted on the tap box housings 148 may be obscured by cables in the data center including power cables 154 and 156. The indicator may be oriented on tap box housing 148 in such a way that it is only visible by standing near the tap box housing 148. The indicator orientation may be such that there is not a line of sight from a remote location 180 at the end of an aisle of rack computers. For example the indicator may be mounted on a bottom side of the tap box housing 148 so that it can only be viewed by standing below tap box housing 148 and cannot be viewed from a remote location 180 at an end of an aisle. In the event of a serious disruption of data center operations, data center personnel may walk each aisle of data center 100 to inspect the indicators mounted on the tap box housings 148. Some data centers, use remote monitoring systems that transmit a signal indication of a circuit breaker state over a network to a central location. In the event of a loss of power to components of the network or due to a network malfunction, the remote monitoring system may fail to provide accurate indication of circuit breaker states.

Tap box assemblies 124, 126, 128, 130, 132, 134, 136, 138, 140, 142, 144, and 146 comprise annunciators 152 that emit a visual signal indicating a state of the one or more circuit protection elements in tap box housings 148 that can be view from a remote location at end 158 of aisle 110. Tap box assemblies 124, 126, 128, 130, 132, 134, 136, 138, 140, 142, 144, and 146 indicate a state of the breakers in each respective tap box assembly independent of data center communication networks. Tap box assemblies 124, 126, 128, 130, 132, 134, 136, 138, 140, 142, 144, and 146 receive power supply directly from busways 114, 116, 118, 120, and 122. In the event of a disruption of data center operations, a data center technician can walk along avenue 114 and scan aisle 110 for an indicator of an open or malfunctioning circuit protection element from a remote location at end 158 of aisle 110 without walking aisle 110. In a similar manner the data center technician can scan aisle 111 and subsequent aisles in data center 100 to quickly locate an open or malfunctioned circuit protection element based on the states indicated by the annunciators 152 of the tap box assemblies 124, 126, 128, 130, 132, 134, 136, 138, 140, 142, 144, and 146 in data center 100.

FIG. 1B illustrates an aisle of rack computer systems coupled to busways via tap boxes with suspended annunciators, according to some embodiments. FIG. 1B depicts a field of view of the same racks 102 and 104 depicted in FIG. 1A from the perspective of a person standing at end 158 of aisle 110. Busways 114 and 116 extend at an elevated position along aisle 110. Tap box assemblies 124, 126, 128, and 130 are coupled to busway 114. Tap box assemblies 132, 134, 136, and 138 are coupled to busway 116. Tap box assembly 124 is coupled to busway 114 nearest end 158 of aisle 110. Tap box assembly 128 is coupled to busway 114 farthest from end 158 of aisle 110. In some embodiments, annunciator line 150 positions annunciator 152 of tap box assembly 128 at a lower height than annunciator 164 of tap box assembly 124. Annunciator 168 of tap box assembly 130 may be suspended to a height slightly above annunciator 152 of tap box assembly 128. Annunciator 170 of tap box assembly 126 may be suspended to a position slightly above annunciator 168 of tap box assembly 130 but slightly below annunciator 164 of tap box assembly 124. Annunciators 164, 170, 168, and 152 may be suspended so that each successive annunciator from end 158 of aisle 110 is positioned slightly lower than the preceding annunciator. In a similar manner, annunciators 172, 174, 176, and 178 may be suspended so that each successive annunciator from end 158 of aisle 110 is positioned slightly lower that the preceding annunciator. The differing positions of annunciators 152, 170, 168, and 164 may enable a data center technician to easily view annunciators 152, 170, 168, and 164 from end 158 of aisle 110 without walking down aisle 110.

In some embodiments, annunciators 152, 170, 168, and 164 and annunciators 172, 174, 176, and 178 may be positioned in a tiered pattern so that annunciators 152 and 170 are positioned at a specific position and annunciators 172 and 174 are positioned at a similar specific position and annunciators 168 and 164 and annunciators 176 and 178 are positioned at a different position that is lower than the specific positioned that annunciators 152, 170, 172, and 174 are positioned to.

In some embodiments annunciator line 162 of tap box assembly 124 is adjusted to avoid obstructions that may block the view of annunciator 164 from end 158 of aisle 110. For example, power cable 156 that couples tap box housing 124 to rack 104 may obscure the view of annunciator 164. Annunciator line 162 may be adjusted to position annunciator 164 at a higher position or lower position to avoid obstructing the view of annunciator 164 from end 158 of aisle 110. Annunciators 170, 168, 164, 172, 174, 176, and 178 may be adjusted in a similar manner to avoid obstructions that may obscure the view of annunciators 170, 168, 164, 172, 174, 176, and 178 from end 158 of aisle 110. In some embodiments, annunciators 164, 170, 168, 152, 172, 174, 176, and 178 may be positioned at equivalent positions.

Figure 2A:
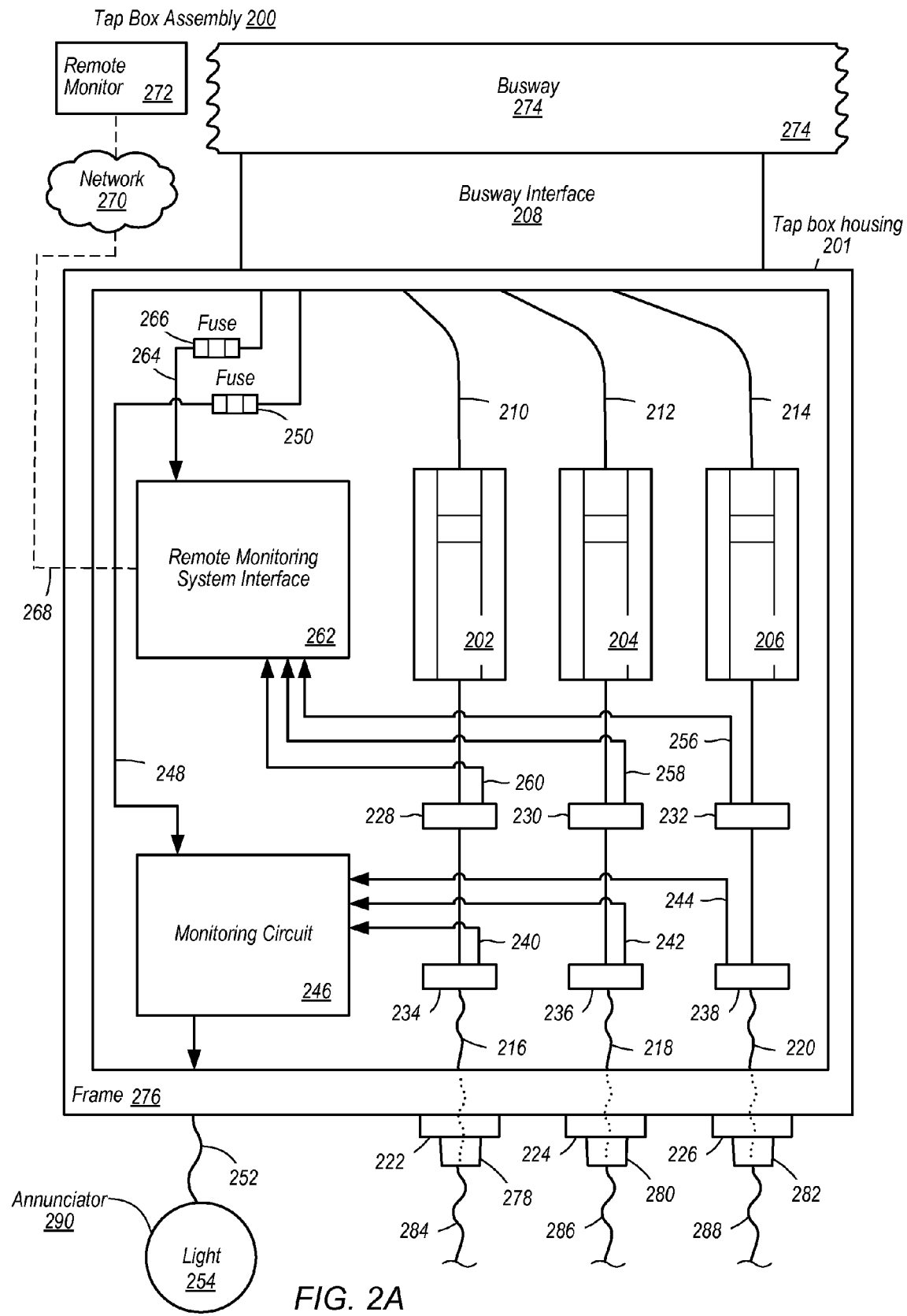
FIG. 2A illustrates a tap box assembly, according to some embodiments.

FIG. 2A illustrates a tap box assembly, according to some embodiments. Tap box assembly 200 comprises tap box housing 201, annunciator line 252 and annunciator 290. Tap box housing 201 is coupled to busway 274 by busway interface 208. Busway interface 208 couples tap box housing 201 to busway 274 so that tap box housing 201 is supported by busway 274. In some embodiments, tap box housing 201 couples to a left or right side of busway 274. In some embodiments, tap box housing 201 couples to a bottom side of busway 274. Busway interface 208 electrically couples tap box housing 201 to busway 274. In some embodiments, busway interface 208 comprises clamps that electrically couple tap box housing 201 to busway 274. In some embodiments, busway interface 208 comprises one or more wires that electrically couple tap box housing 201 to busway 274. In some embodiments, other well-known methods are used to electrically couple tap box housing 201 to busway 274.

Tap box housing 201 comprises frame 276 and circuit protection elements 202, 204, and 206 electrically coupled to busway interface 208 by electric lines 210, 212, and 214 mounted in frame 276. Circuit protection elements 202, 204, and 206 are electrically coupled to electric receptacles 222, 224, and 226 by electric lines 216, 218, and 220. Plugs 278, 280, and 282 couple to receptacles 222, 224, and 226 and provide circuit protected electrical power to computer systems in a data center via electric lines 284, 286, and 288 coupled to plugs 278, 280, and 282. Electric lines 216, 218, and 220 downstream of circuit protection elements 202, 204, and 206 pass through current sensors 234, 236, and 238 which are coupled to monitoring circuit 246. In some embodiments, current sensors 234, 236, and 238 measure a magnetic field induced by current flow through lines 216, 218, and 220 without physically connecting to electrical lines 216, 218, and 220. In some embodiments, current sensors 234, 236, and 238 are electrically coupled to electric lines 216, 218, and 220 and directly measure current flow through lines 216, 218, and 220 via the electrical coupling to electric lines 216, 218, and 220. In some embodiments, sensors 234, 236, and 238 are voltage sensors that sense a voltage when circuit protection elements 202, 204, and 206 are closed and do not sense a voltage when circuit protection elements 202, 204, and 206 are open. In some embodiments, other well-known apparatuses for measuring current flow through lines 216, 218, and 220 may be used.

Monitoring circuit 246 receives a voltage signal from current sensors 234, 236, and 238 via signal lines 240, 242, and 244. The voltage signal received via lines 240, 242, and 244 is proportional to the current flow through lines 216, 218, and 220 sensed by current sensors 234, 236, and 238 or another quantity measured by sensors 234, 236, and 238. Monitoring circuit 246 may comprise a logical circuit that determines if the voltage signal from current sensors 234, 236, and 238 exceeds a threshold. If the voltage signal exceeds the threshold, monitoring circuit 246 may indicate that circuit protection elements 202, 204, and 206 are in a closed state and not malfunctioning. To indicate the state of circuit protection elements 202, 204, and 206 monitoring circuit 246 causes light 254 of annunciator 290 to emit a colored light. In some embodiments annunciator 290 comprises more than one light 254. Monitoring circuit 246 may cause a first light 254 of annunciator 290 to emit a light if the voltage signal from current sensors 234, 236, and 238 is above a threshold that indicates a closed circuit and cause a second light 254 of annunciator 290 to emit a different colored light if the voltage signal from current sensors 234, 236, and 238 is below the threshold. For example, annunciator 290 may include a red light and a green light. Monitoring circuit 246 may cause the green light to emit light if the voltage signal from current sensors 234, 236, and 238 indicate that circuit protection elements 202, 204, and 206 are in the closed position, and monitoring circuit 246 may cause the red light to emit light if the voltage signal from current sensors 234, 236, and 238 indicates that one or more of circuit protection elements 202, 204, and 206 are open or malfunctioning. In some embodiments, monitoring circuit 246 causes light 254 of annunciator 290 to emit a continuous light if the voltage signal from current sensors 234, 236, and 238 is above a threshold that indicates circuit protection elements 202, 204, and 206 are in the closed position and monitoring circuit 246 causes light 254 to flash if the voltage signal from current sensors 234, 236, and 238 is below a threshold indicating that one or more of circuit protection elements 202, 204, or 206 are open or malfunctioning.

In some embodiments, sensors 234, 236, and 238 may be voltage sensors (instead of current sensors that transmit a voltage signal). Voltage sensors 234, 236, 238 may transmit the voltage of lines 216, 218, and 220 to monitoring circuit 246. Monitoring circuit 246 may cause annunciator 290 to emit a visual signal indicating a closed circuit breaker if voltage is transmitted to monitoring circuit 246 from voltage sensors 234, 236, and 238. Monitoring circuit 246 may cause annunciator 290 to emit a visual signal indicating an open circuit breaker if one or more of the voltage sensors 234, 236, or 238 does not transmit a voltage from lines 216, 218, or 220. In some embodiments, other well-known methods may be used to determine the state of circuit breakers 202, 204 and 206.

In some embodiments, monitoring circuit 246 receives both current and voltage measurements from sensors 234, 236, and 238. In some embodiments, monitoring circuit 246 receives signals indicating the state of tap box housing 201 including temperature, humidity, presence of smoke, etc.

Monitoring circuit 246 receives fuse protected electrical power directly from busway interface 208 via electrical line 248 and fuse 250. Fuse 250 protects monitoring circuit 246 from an overload or short circuit. Fuse 250 protects busway 274 from a short circuit in monitoring circuit 246 drawing excessive power from busway 274 causing busway 274 to trip and fail to provide electrical power to the devices that receive electrical power from busway 274. Monitoring circuit 246 supplies power to annunciator 290 via wire 252.

In some embodiments, monitoring circuit 246 may comprise logic implemented in hardware to determine to emit a visual signal from annunciator 290 based on signals received from sensors 234, 236, and 238. In some embodiments, monitoring circuit 246 may comprise software stored in a memory and executable by one or more computer systems to determine to emit a visual signal from annunciator 290 based on signals from sensors 234, 236, and 238.

In some embodiments, tap box housing 201 comprises current sensors 228, 230, and 232 coupled to remote monitoring system interface 262. Remote monitoring system interface 262 receives electrical power directly from bus interface via electrical line 264 and fuse 266. Remote monitoring system interface 262 is communicatively coupled to remote monitor 272 via link 268 and network 270. In some embodiments, remote monitor 272 is a display mounted at an end of an aisle that indicates the states of the one or more circuit breakers in each tap box in the particular aisle. In some embodiments, remote monitor 272 is a software application implemented on a remote computer system that receives messages via network 270 indicating the state of the one or more circuit breakers in each tap box connected to remote monitor 272. FIG. 2 illustrates remote monitoring system interface 262 receiving voltage signals from current sensors 228, 230, and 232. In some embodiments, monitoring circuit 246 and remote monitoring system interface 262 may receive voltage signals from the same currents sensors 234, 236, and 238. In some embodiments, remote monitoring system interface 262 is implemented in hardware. In some embodiments, remote monitoring system interface 262 is implemented in software stored in a memory and executable by one or more processors. In some embodiments, remote monitoring interface 262 and monitoring circuit 246 are independent such that the two systems do not share power supplies, sensors, or sensor connections between the sensors and the remote monitoring interface or the monitoring circuit.

Tap box housing 201, annunciator 290 and annunciator line 252 may be any of the tap box housings 148, annunciators 152 and annunciator lines 150 described in FIG. 1A in regards to tap box assemblies 124, 126, 128, 130, 132, 134, 136, 138, 140, 142, 144, and 146.

Figure 2B:
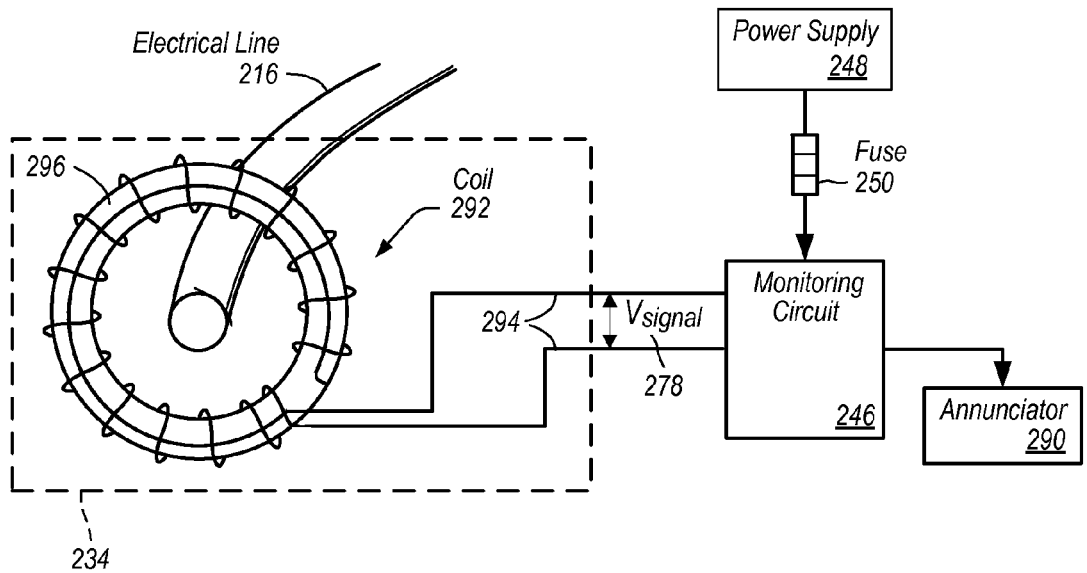
FIG. 2B illustrates a monitoring circuit, according to some embodiments.

FIG. 2B illustrates a monitoring circuit, according to some embodiments. FIG. 2B shows the same electrical line 216, current sensor 234, power supply 248 (electrical line 248), fuse 250 and annunciator 290 as shown in FIG. 2A. Current sensor 234 comprises a coil 292 and electrical leads 294. Coil 292 comprises electrical leads 294 wound around non-magnetic core 296. Electrical line 216 is connected to circuit protection element 202 and receptacle 222 depicted in FIG. 2A and passes through coil 292. As electrical current flows through electrical line 216 from circuit protection element 202 to receptacle 222 a magnetic field is developed. The magnetic field developed by electrical line 216 induces a voltage in coil 292. The voltage induced in coil 292 is proportional to the derivate of current flowing through electrical line 216. Monitoring circuit 246 is coupled to electrical leads 294 and receives voltage signal 278 where leads 294 couple to monitoring circuit 246. Monitoring circuit 246 comprises an integrator and conditions voltage signal 276. Monitoring circuit 246 determines if circuit protection element 202 is open or malfunctioning based on voltage signal 278 and one or more thresholds. Monitoring circuit 246 controls annunciator 290 based on the determination of whether circuit protection element 202 is open or malfunctioning. Monitoring circuit 246 receives power directly from busway 274 via power supply 248 and fuse 250. Fuse 250 protects busway 274 and monitoring circuit 246. If the current flowing through power supply 248 (electrical line 248 in FIG. 2A) exceeds a limit, fuse 250 interrupts the flow of current and prevents a short circuit in monitoring circuit 246 from affecting the operation of busway 274.

Figure 2C:
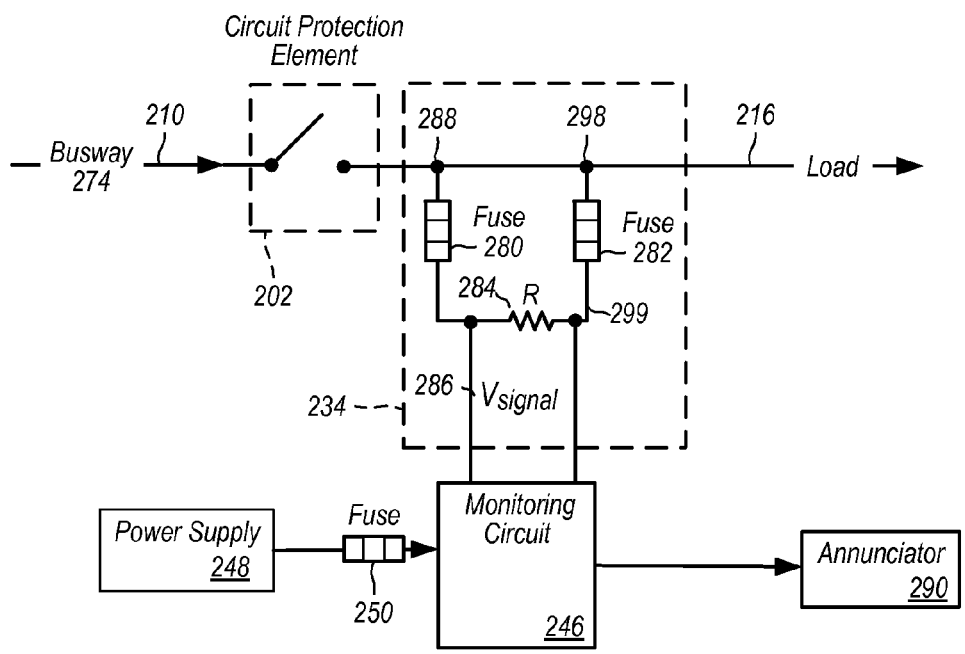
FIG. 2C illustrates a monitoring circuit, according to some embodiments.

FIG. 2C illustrates a monitoring circuit, according to some embodiments. FIG. 2C shows the same busway 274, electrical line 210, circuit protection element 202, current sensor 234, electrical line 216, monitoring circuit 246, power supply 248 (electrical line 248), fuse 250 and annunciator 290 as shown in FIG. 2A. Current sensor 234 comprises resistor 284 in parallel with electrical line 216. Fuses 280 and 282 are located near connection 288 and 298 where current sensor 234 couples to electrical line 216. Monitoring circuit 246 is coupled to either side of resistor 284 to measure signal voltage 286. Resistor 284 has a known resistance so that the current through resistor 284 can be determined based on the voltage change across resistor 284. Monitoring circuit 246 conditions voltage signal 286. Monitoring circuit 246 determines if circuit protection element 202 is open or malfunctioning based on voltage signal 286 and one or more thresholds. Monitoring circuit 246 controls annunciator 290 based on the determination of whether circuit protection element 202 is open or malfunctioning. Monitoring circuit 246 receives power directly from bus 274 via power supply 248 and fuse 250. Fuse 250 protects busway 274 and monitoring circuit 246. If the current flowing through electrical line 248 (power supply 248) exceeds a limit, fuse 250 interrupts the flow of current and prevents a short circuit in monitoring circuit 246 from affecting the operation of busway 274. Fuses 280 and 282 protect against a short circuit in circuit sensor 234 causing circuit protection element 202 to trip. If the current flowing through electrical branch 299 exceeds a limit fuses 280 and 282 interrupt the flow of current through electrical branch 299. Fuses 280 and 282 are configured to interrupt the flow of current through electrical branch 299 at a current threshold below the rating of circuit protection element 202 so that a defect in current sensor 234 does not cause circuit protection element 202 to trip, but instead results in a blown fuse 280 or 282.

Figure 3:
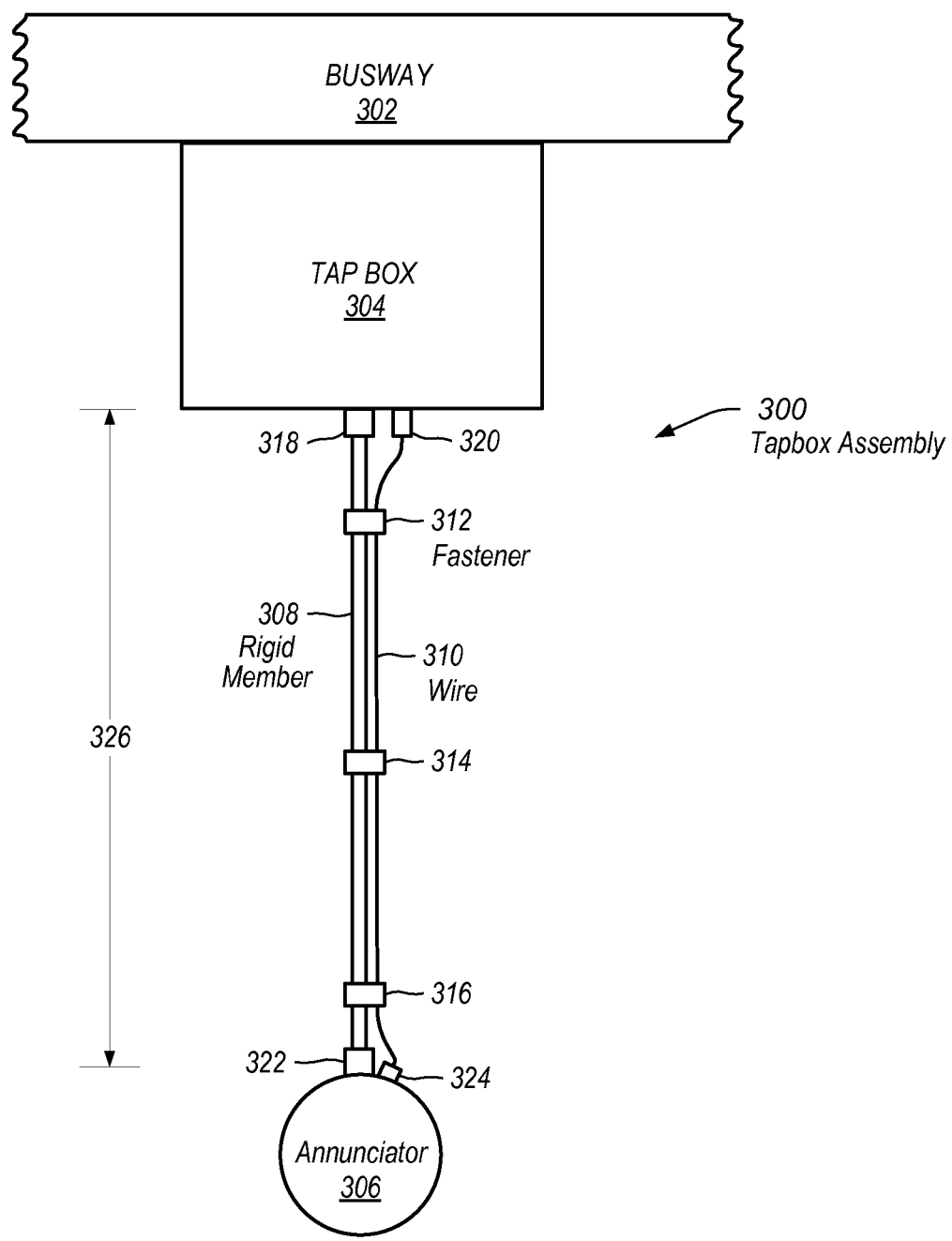
FIG. 3 illustrates a tap box assembly with a rigid member, according to some embodiments.

FIG. 3 illustrates a tap box assembly with a rigid member, according to some embodiments. Tap box assembly 300 comprises tap box housing 304 coupled to busway 302, wire 310, rigid member 308, and annunciator 306. Annunciator 306 is electrically coupled to tap box housing 304 by wire 310. Interface seal 320 couples wire 310 to tap box housing 304 and prevents dust and particulate matter from entering tap box housing 304. Interface seal 324 couples wire 310 to annunciator 306 and prevents dust and particulate matter from entering annunciator 306.

Rigid member 308 suspends annunciator 306 at a certain distance 326 below tap box housing 304. Rigid member 308 provides structural support for annunciator 306 so that the weight of annunciator 306 is not supported by wire 310 alone. Rigid member 308 maintains annunciator 306 in a stationary position so that annunciator 306 is not displaced by air flow from air ducts in an aisle, exhaust air from rack computer systems, etc. Rigid member 308 is physically coupled to tap box housing 304 by fitting 318 and physically coupled to annunciator 306 by fitting 322. Fittings 318 and 322 may be threaded fittings and rigid member 308 may comprise threaded ends that thread into fittings 318 and 322. Fittings 318 and 322 may comprise a pin that fits into a pinhole drilled in either end of rigid member 308 and secures rigid member 308 to tap box housing 304 and annunciator 306 via fittings 318 and 322. In some embodiments, other well-known devices for fastening rigid member 308 to tap box housing 304 and annunciator 306 are used. Rigid member 308 may be made of a lightweight rigid material including fiberglass, plastic, etc. The distance between tap box housing 304 and annunciator 306 may be adjusted by adjusting rigid member 308 and wire 310. For example, rigid member 308 may be made of plastic and cut to a desired length to achieve a certain separation distance between tap box housing 304 and annunciator 306. Rigid member 308 may have pinholes drilled in either end of rigid member 308 after being cut to the desired length so that the pinholes accept a pin that couples rigid member 308 to fittings 318 and 322. Fasteners 312, 314, and 316 securely couple wire 310 to rigid member 308. In some embodiments, fasteners 312, 314, and 316 may be cable ties. Wire 310 may be adjusted by coiling extra wire into a coil and securing the coil with a fastener 312. Wire 310 may be cut to a desired length. In some embodiments, fasteners 312, 314, and 316 may be a shrink wrap that covers wire 310 and rigid member 308 from tap box housing 304 to annunciator 306. In some embodiments, other well-known methods are used to secure wire 310 to rigid member 308.

In some embodiments, fitting 318 comprises a magnet that secures rigid member 308 to tap box 304. Fitting 320 may be an electrical quick release connection that electrically couples wire 310 to tap box 304 via one or more magnets that cause an electrical connector attached to wire 310 to engage an electrical connector attached to tap box 304. Fittings 318 and 320 may be configured to break away from tap box 304 in response to an impact without damaging tap box 304, wire 310, or fasteners 318 and 320. For example, a data center technician performing maintenance may inadvertently pull annunciator 306 with a tool such as a cart or ladder. Fittings 318 and 320 may permit annunciator 306, rigid member 308 and wire 310 to break away from tap box 304 to prevent wire 310 being pulled by the tool from damaging any circuitry connected to wire 310 in tap box 304.

Tap box housing 304, annunciator 306, rigid member 308, and wire 310 may be any of the tap box housings 148, annunciators 152 and annunciator lines 150 described in FIG. 1A in regards to tap box assemblies 124, 126, 128, 130, 132, 134, 136, 138, 140, 142, 144, and 146. Tap box housing 304, annunciator 306, rigid member 308, and wire 310 may be tap box housing 201, annunciator 290, and annunciator line 252 described in FIG. 2A.

Figure 4:
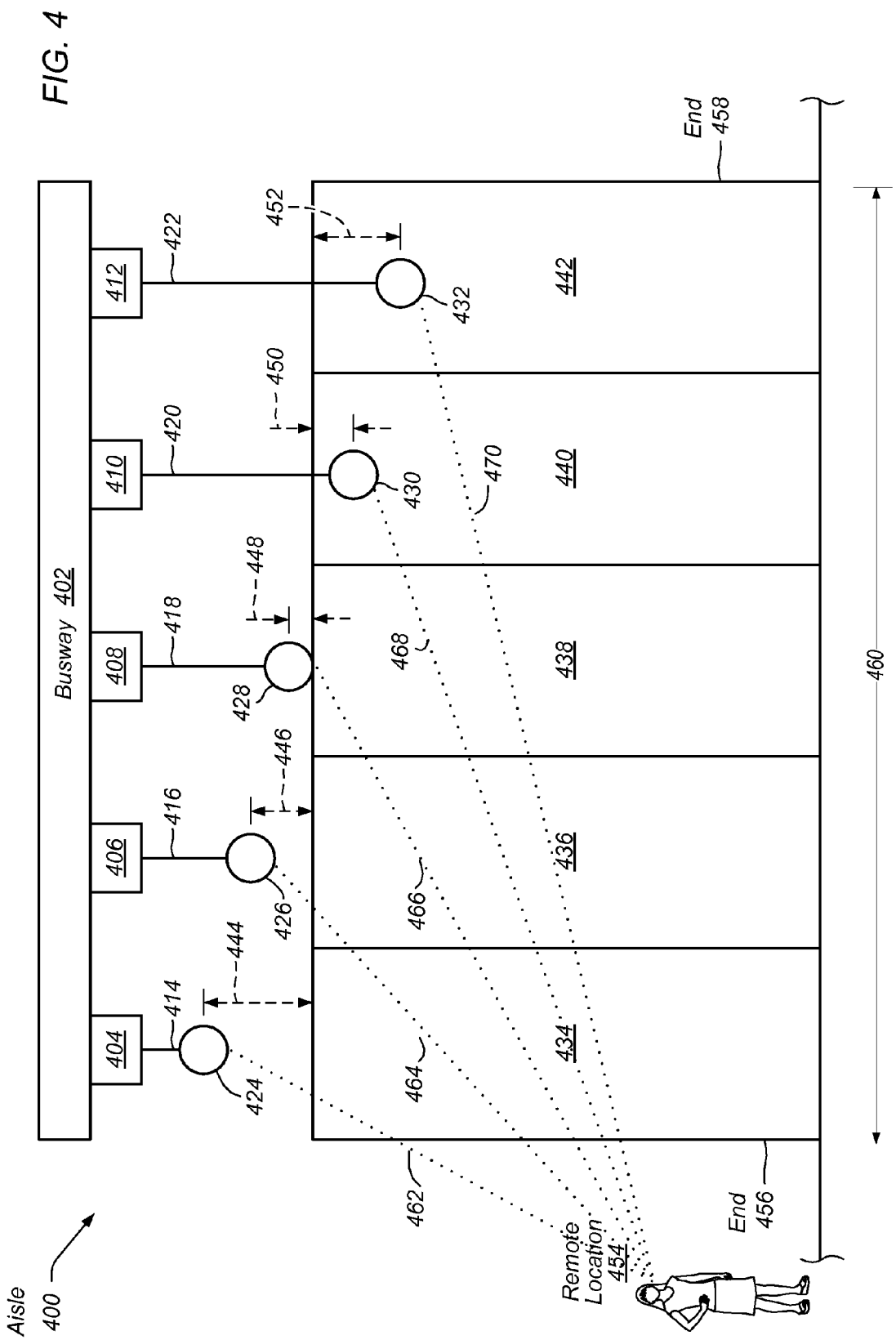
FIG. 4 illustrates tap boxes coupled to a busway extending the length of an aisle of rack computers, according to some embodiments.

FIG. 4 illustrates tap boxes coupled to a busway extending a length of an aisle of rack computers, according to some embodiments. Aisle 400 comprises rack computers 434, 436, 438, 440, and 442. Busway 402 extends along length 460 of aisle 400 at an elevated position above rack computers 434, 436, 438, 440, and 442. Tap box housings 404, 406, 408, 410, and 412 couple to the bottom side of busway 402 at various locations along busway 402. Annunciator lines 414, 416, 418, 420, and 422 suspend annunciators 424, 426, 428, 430, and 432 at progressively lower heights when viewed from remote location 454. The varying heights of annunciators 424, 426, 428, 430, and 432 enable a data center technician to observe annunciators 424, 426, 428, 430, and 432 from remote location 454 without walking down aisle 400. For example a data center technician standing at remote location 454 at end 456 of aisle 410 has view 462 of annunciator 424 which is distance 444 above rack 434. Annunciator 426 hangs at an elevation which is below the elevation at which annunciator 424 hangs and is distance 446 above rack 436. View 464 of annunciator 426 is not obscured by annunciator 424. Annunciator 428 hangs below annunciators 424 and 426. View 466 of annunciator 428 is not obscured by annunciator 424 and 426. Annunciator 430 hangs below annunciators 424, 426, and 428. View 468 of annunciator 430 is not obscured by annunciators 428, 426, and 424. Annunciator 432 hangs below annunciators 424, 426, 428, and 430. Annunciator 432 is suspended distance 452 below rack 442. View 470 of annunciator 432 is not obscured by annunciators 424, 426, 428, and 430. In some embodiments, annunciators 424, 426, 428, 430, and 432 may be suspended below tap boxes 404, 406, 408, 410, and 412 in a staggered configuration in which annunciators closer to end 456 of aisle 410 are suspended at a specific height and annunciators closer to opposite end 458 are suspended at a height lower than the specific height of the annunciators closest to end 456.

In some embodiments, aisle 400 may run perpendicular to an avenue through a data center adjacent to end 456 of aisle 410. A data center technician may observe the state of circuit protection elements in tap boxes in one or more aisles 400 by walking down the avenue and looking down aisle 400 from remote location 454.

Tap box housings 404, 406, 408, 410, and 412; annunciators 424, 426, 428, 430, and 432; and annunciator lines 414, 416, 418, 420, and 422 may be any of the tap box housings, annunciators, and annunciator lines described in regards to FIGS. 1-3 and 7-9.

Figure 5B:
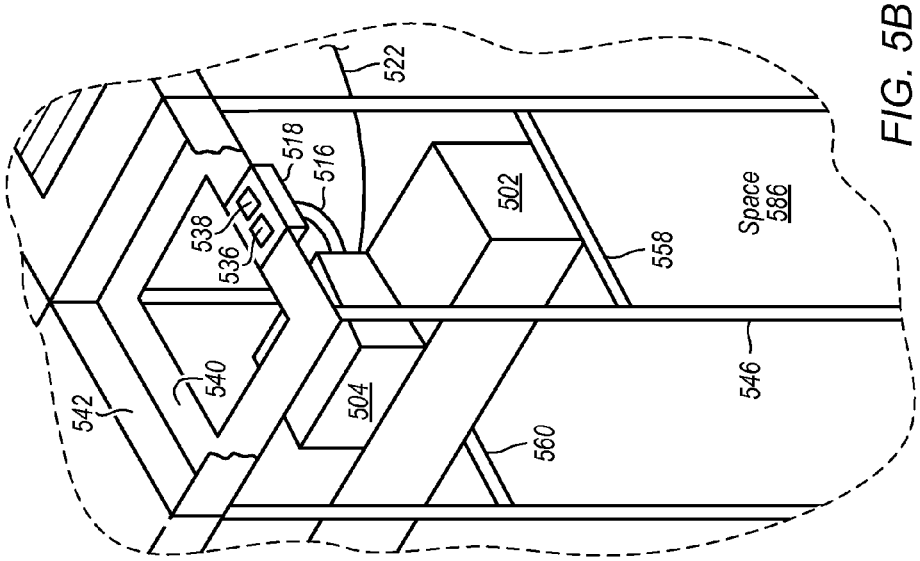
FIG. 5B illustrates a tap box coupled to a busway extending in an underfloor space, according to some embodiments.
Figure 5A:
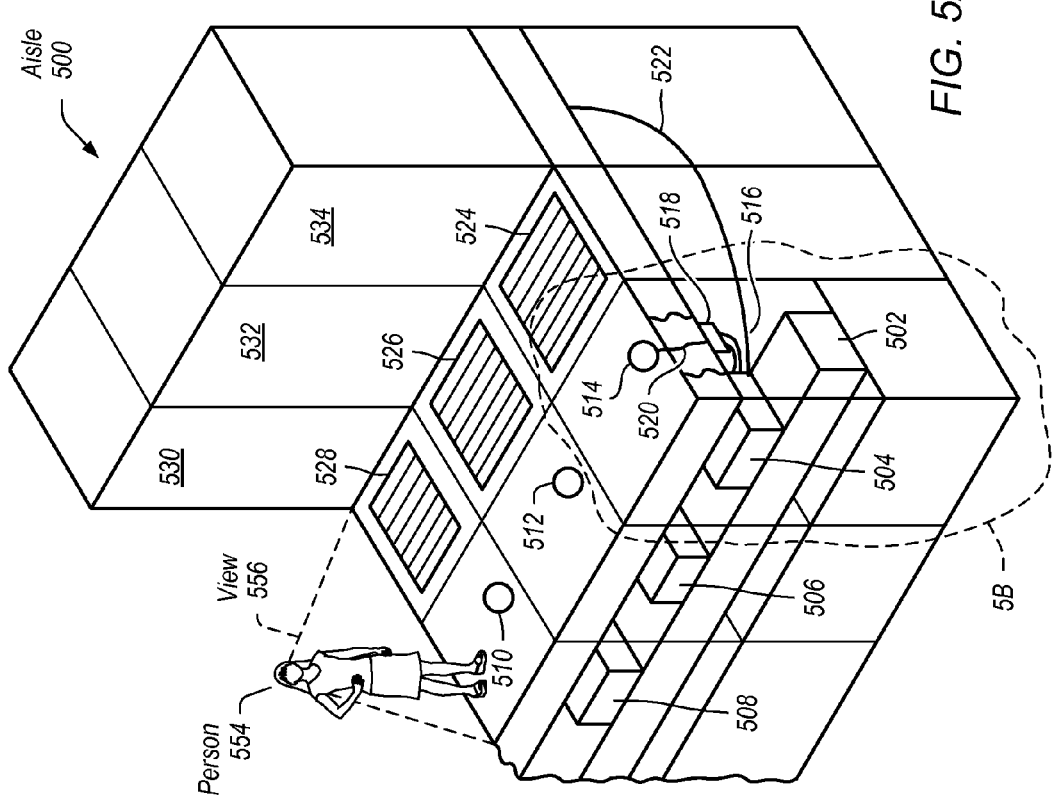
FIG. 5A illustrates tap boxes coupled to a busway extending in an underfloor space, according to some embodiments.

FIG. 5A illustrates tap boxes coupled to a busway extending in an underfloor space, according to some embodiments. Aisle 500 comprises rack computers 530, 532, and 534. Air vents 524, 526, and 528 are located in the first row adjacent to rack computers 530, 532, and 534. Annunciators 510, 512, and 514 are located in the second row and adjacent to vents 524, 526, and 528. Annunciators 510, 512, and 514 comprise floor tiles with a light embedded in the floor tile and coupled to wire 520 that couples to male connectors on the lower side of annunciators 510, 512, and 514. Busway 502 extends in underfloor space 586 along aisle 500. Tap box housings 504, 506, and 508 are coupled on the top side of busway 502. Tap box housing 504 distributes breaker supported electrical power from busway 502 to rack computers 534 via power cable 522. Tap box housings 506 and 508 distribute circuit supported electrical power to rack computers 530 and 532 in a similar manner as tap box 504.

Figure 5C:
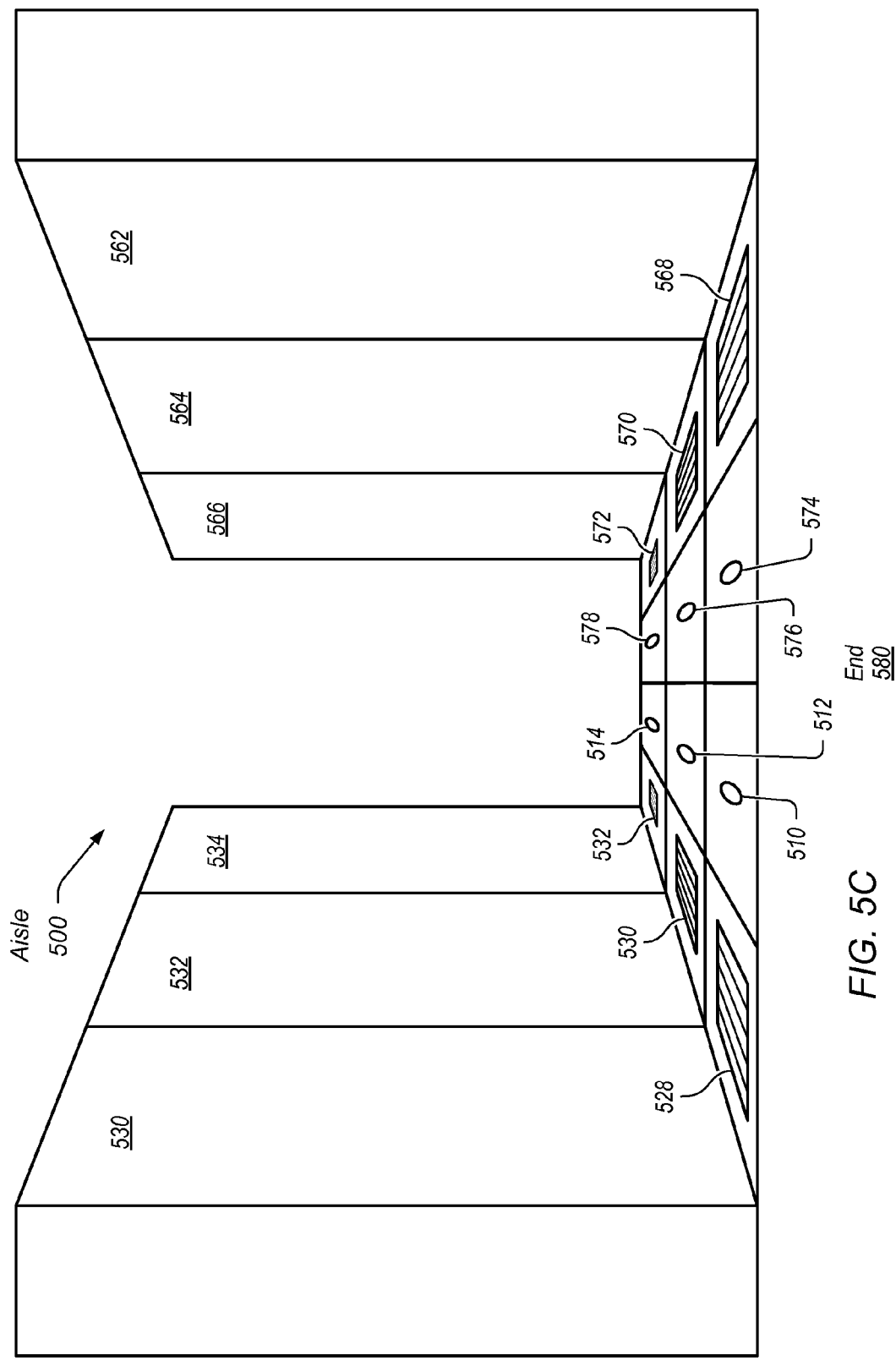
FIG. 5C illustrates annunciators comprising floor tiles extending along an aisle of rack computer systems, according to some embodiments.

Tap box housing 504 couples to annunciator 514 via annunciator line 516 and connectors 518. Tap box housings 506 and 508 couple to annunciators 510 and 512 in a similar manner. FIG. 5A depicts person 554 with view 556 of aisle 500. FIG. 5C shows a perspective view of aisle 500 from the perspective of person 554.

FIG. 5B illustrates a tap box coupled to a busway extending in an underfloor space, according to some embodiments. In FIG. 5B a portion of space 586 is shown with annunciator 514 removed so that connectors 518 are visible. Busway 502 is supported by horizontal supports 558 and 560 attached to underfloor structure 546. Tap box housing 504 is coupled to the top side of busway 502. Power cable 522 couples tap box housing 504 to rack computers 534. Annunciator line 516 couples to connector housing 518. Connector housing 518 comprises two female receptacles that accept two male connectors mounted on the lower side of annunciator 514. In some embodiments, connector housing 518 may comprise more or less connectors 536 and 538 based at least in part on the number of indicator lights included in annunciator 514. For example, in some embodiments annunciator 514 may include a green light to indicate the circuit protection elements in tap box housing 504 are closed and a red light to indicate one or more of the circuit protection elements in tap box housing 504 are open or malfunctioning. Connector housing 518 is mounted in lip 540 of underfloor structure 546. Lip 540 extends around the perimeter of floor tile slot 542 and supports annunciator 514 (which includes a floor tile) when annunciator 514 is installed in floor tile slot 542.

Lip 540 also positions annunciator 514 in floor tile slot 542 by engaging a groove on the lower side of annunciator 514. Annunciator 514 is shown in detail in FIGS. 6A and 6B.

FIG. 5C illustrates annunciators comprising floor tiles extending along an aisle of rack computer systems, according to some embodiments. Aisle 500 comprises the same rack computer systems 530, 532, and 534; vents 524, 526 and 528; and annunciators 510, 512, and 514 depicted in FIG. 5A. Aisle 500 also comprises rack computer systems 562, 564, 566; vents 568, 570, and 572; and annunciators 574, 576, and 578. Annunciators 574, 576, and 578 are configured in a similar manner as annunciators 510, 512, and 514 and include a floor tile with one or more lights embedded in the floor tile. FIG. 5C depicts view 556 of aisle 500 from the perspective of person 554 in FIG. 5A. Person 554 is standing at end 580 of aisle 500 and can see annunciators 510, 512, 514, 574, 576, and 578 from end 580 of aisle 500 without walking down aisle 500. In some embodiments, an avenue may extend through a data center perpendicular to aisle 500 adjacent to end 580. A data center technician may scan the state of the circuit protection elements in the tap boxes associated with aisle 500 by walking down the avenue and looking down aisle 500 from end 580.

Tap box housings 502, 504, 506, 508 described in FIGS. 5A-5B may be tap box housing 201 described in FIGS. 2A-2C.

Figure 6A:
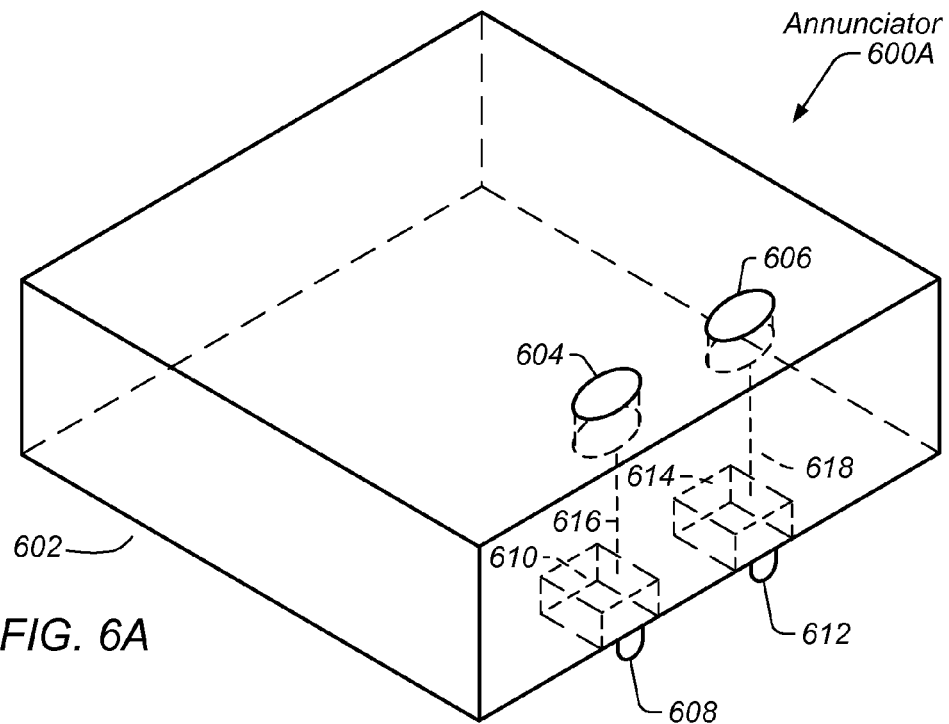
FIG. 6A illustrates a perspective view of an upper surface of an annunciator comprising a floor tile, according to some embodiments.
Figure 6B:
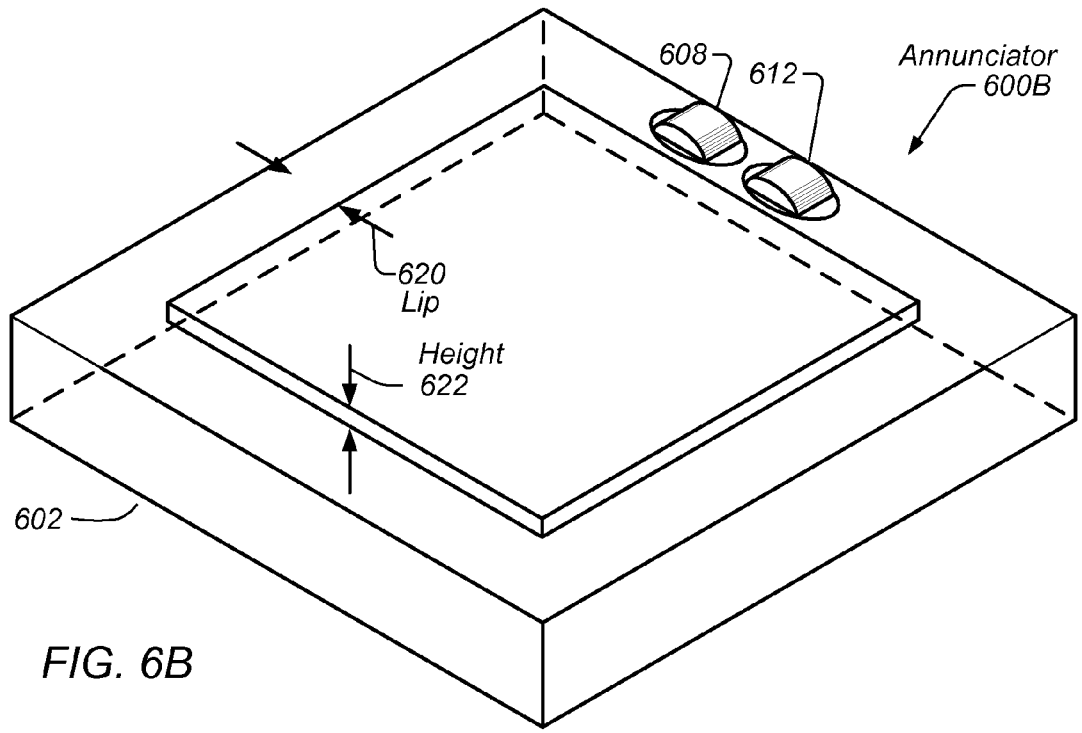
FIG. 6B illustrates a perspective view of a lower surface of an annunciator comprising a floor tile, according to some embodiments.

FIG. 6A illustrates a perspective view of an upper surface of an annunciator comprising a floor tile, according to some embodiments. Annunciator 600A and Annunciator 600B illustrated in FIG. 6B are the same annunciator Annunciators 600A and 600B may be the same annunciator 514 illustrated in FIG. 5A. Annunciator 600A comprises floor tile 602, indicator lights 604 and 606, and male connectors 608 and 612. Male connectors 608 and 612 are coupled to connector housings 610 and 614 that are recessed into floor tile 602 so that connector housing 610 and 614 are flush with the surface of floor tile 602 and male connectors 608 and 612 protrude from the surface of floor tile 602. Indicator lights 604 and 606 are electrically coupled to male connectors 608 and 612 by wires 616 and 618 embedded in floor tile 602.

Annunciator 600A may be installed in an underfloor structure similar to underfloor structure 546 described in regards to FIG. 5B. The underfloor structure may comprise female connectors that couple with male connectors 608 and 612. The female connectors may be electrically coupled to a tap box housing so that indicator lights 604 and 606 are coupled to the tap box housing via the female connectors and male connectors by installing annunciator 600A into the underfloor structure.

FIG. 6B illustrates a perspective view of a lower surface of an annunciator comprising a floor tile, according to some embodiments. Annunciator 600B is the same annunciator as Annunciator 600A depicted in FIG. 6A. Annunciator 600B may be the same annunciator 514 depicted in FIG. 5A. FIG. 6B depicts the lower side of annunciator 600B which includes lip 620 that is recessed from the bottom surface of floor tile 602 by height 622. Male connectors 608 and 612 are mounted on lip 620 and aligned so that they couple with female connectors mounted on a corresponding lip of an underfloor structure. Lip 620 fits into a lip of an underfloor structure to align male connectors 608 and 612. Lip 620 also maintains annunciator 600B in a fixed position when installed in a corresponding lip of an underfloor structure. In some embodiments, annunciator 600B may be adapted to comprise an existing floor tile 602 that meshes with an existing underfloor structure.

Annunciator 600A and 600B may be annunciators 510, 512, 514, 574, 576, and 578 described in FIGS. 5A-5C.

Figure 7:
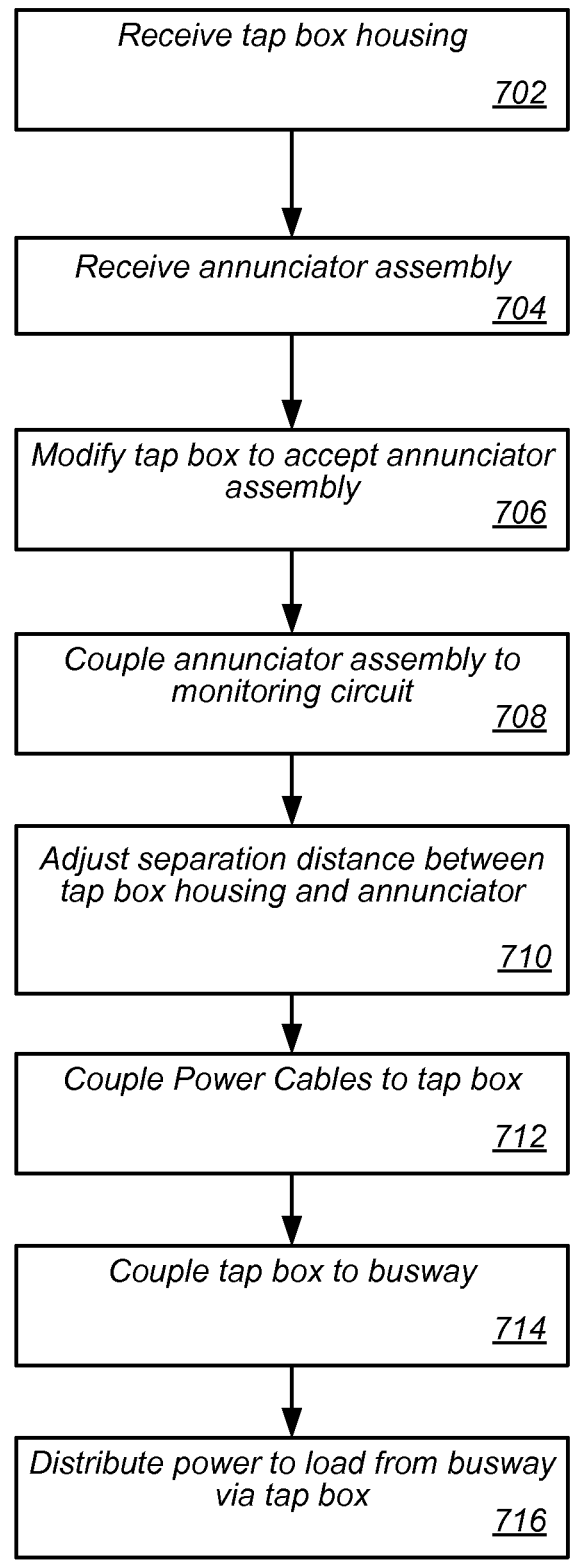
FIG. 7 illustrates installing a tap box assembly with separated annunciator, according to some embodiments.

FIG. 7 illustrates installing a tap box assembly with separated annunciator, according to some embodiments. At 702, a tap box housing is received. The tap box housing may be a new tap box or a used tap box. The tap box housing comprises one or more circuit protection elements, a busway interface, and one or more receptacles to accept plugs from power cables that provide circuit protected electrical power to rack computers in a data center.

At 704 the annunciator assembly is received. The annunciator assembly includes an annunciator, an annunciator line, current sensors, a monitoring circuit, and related wires and fuses. In some embodiments, the annunciator assembly includes a remote monitoring system interface. In some embodiments, the annunciator assembly includes voltage sensors.

At 706, the tap box housing received at 702 is modified to accept the annunciator assembly. Modifying the tap box can include installing the monitoring circuit and coupling the monitoring circuit to a busway interface of the tap box with an electrical line with an inline fuse. Modifying the tap box to accept the annunciator assembly can include creating an opening in the tap box housing to accept an annunciator line coupled to an indicator light. In some embodiments, modifying the tap box housing to accept the annunciator assembly includes installing a remote monitoring system interface and providing power to the remote monitoring system interface via an electrical line with inline fuse coupled to the busway interface.

At 708, the annunciator assembly is coupled to the circuit protection elements in the tap box. In some embodiments, the annunciator assembly includes current sensors that are inductors that measure the magnetic field induced by the flow of current from the circuit protection elements. Installing current sensors that are inductors to the circuit protection elements includes disconnecting the wire running from the circuit protection elements in the tap box to the receptacles mounted on the tap box, inserting the inductor current sensors around the disconnected wire and re-connecting the wire. In some embodiments, the annunciator assembly includes current sensors that include a resistor in parallel with the circuit protection element load circuit. Installing current sensors that include a resistor in parallel with the circuit protection element load circuit includes removing the wire running from the circuit protection elements in the tap box to the receptacles mounted on the tap box and replacing the wire with a current sensor that includes a load wire that runs from the circuit protection element to a receptacle mounted on the tap box and a parallel leg that includes a resistor. The current sensor functions as a load wire and as a current sensor and is coupled to the same connection points as the load wire that was removed. In some embodiments, coupling the annunciator assembly to the circuit protection elements includes coupling voltage sensors on the downstream side of the circuit protection elements and connecting and coupling the voltage sensors to a monitoring circuit. In some embodiments, other well-known sensors may be used.

At 710, the separation distance between the tap box housing and the annunciator is adjusted. The tap box housing and the annunciator are separated by an annunciator line. The annunciator line can be adjusted to position the annunciator at different distances below the tap box housing depending on the location in an aisle where the tap box assembly is to be installed. For example, a tap box assembly installed near an end of an aisle proximate to an avenue may comprise an annunciator that is separated from a tap box housing by a shorter distance. A tap box assembly installed away from and end of an aisle proximate to an avenue may comprise an annunciator that is separated from a tap box housing by a greater distance than the tap box assembly near the end of the aisle proximate to the avenue. Tap box assemblies with annunciators separated from their respective tap box housings by different distances enable a data center technician to observe the status indicated by the annunciators from a remote location including an end of an aisle proximate to an avenue. In some embodiments, the annunciator line comprises a wire that can be adjusted to the proper separation distance. In some embodiments, the annunciator line includes a rigid member and a wire that electrically couple the tap box housing to the annunciator. In embodiments with a rigid member, the rigid member may be cut to the desired separation distance. The rigid member may be coupled to the tap box housing and the annunciator via threaded fittings. After cutting the rigid member, the ends of the rigid member may be threaded to couple to the threaded fittings. In some embodiments, the rigid member may couple to the tap box housing and the annunciator via a fitting with a pinned connection. After cutting the rigid member, a pinhole may be drilled in either end of the rigid member to couple with the pinned connection fittings. In some embodiments, the tap box housing may mount on a busway that extends in an underfloor space and adjusting the separation distance between the tap box housing and the annunciator may include installing a connector housing to an underfloor structure so that an annunciator that comprises a floor tile can connect male connectors of the annunciator with female connectors of the connector housing. In some embodiments, the separation distance between the tap box housing and annunciator is not be adjusted.

At 712, the power cables are coupled to the tap box housing. The power cables plug into the receptacles mounted on the tap box housing and couple to rack computer systems in a data center. Coupling the power cables to the tap box includes engaging a plug of the power cables in a receptacle of the tap box housing.

At 714, the tap box assembly including the tap box housing and annunciator assembly is coupled to the busway. In some embodiments the tap box assembly may couple to the bottom side of the busway via clamps or electrical wires. In some embodiments, the tap box assembly may couple to the busway on a side of the busway. The busway may extend along an aisle of rack computer systems at an elevated position. The busway may be in an underfloor space and extend the length on an aisle in the underfloor space.

At 716, power is distributed from the busway to a load via the tap box assembly. Electrical power flows from the busway through the busway interface coupled to the busway into one or more circuit protection elements in the tap box housing. The electrical power then flows from the circuit protection elements to receptacles mounted to the tap box housing. Current sensors sense the current of the electrical power as it flows from the circuit protection elements to the receptacles mounted on the tap box housing. The electrical power flows from the receptacles to rack computer systems in the data center via power cables plugged into the receptacles of the tap box housing.

Any of the tap box assemblies described in FIGS. 1-6 may be configured and installed as described in FIG. 7.

Figure 8:
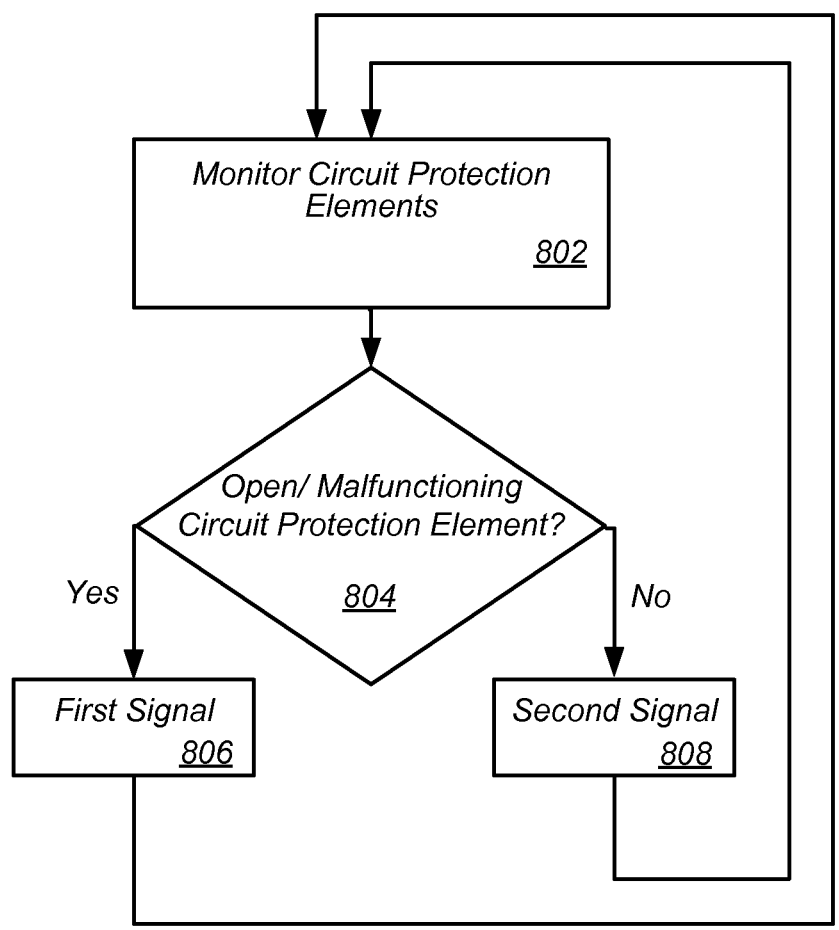
FIG. 8 illustrates decisions made by a tap box assembly with separated annunciator, according to some embodiments.

FIG. 8 illustrates decisions made by a tap box assembly with separated annunciator, according to some embodiments. At 802, the tap box assembly with separated annunciator monitors the circuit protection elements included in a tap box housing. Current sensors sense the current flowing from each circuit protection element and send a voltage signal proportionate to the current to a monitoring circuit. The monitoring circuit may be implemented in hardware or may be implemented in software including computer executable instructions stored in a memory.

At 804, the tap box assembly with separated annunciator determines if one or more of the circuit protection elements in the tap box is open or malfunctioning. The monitoring circuit determines the state of the one or more circuit protection elements based on the voltage signals received from the current sensors at 802. The monitoring circuit compares the signals from the current sensors to pre-determined thresholds to determine the state of the one or more circuit protection elements. For example a current below a threshold may indicate an open circuit protection element. A current above a threshold may indicate a malfunctioning circuit protection element.

At 806, in response to determining one or more circuit protection elements is open or malfunctioning the tap box assembly with separated annunciator emits a first signal. The monitoring circuit illuminates a light in the annunciator to indicate one or more of the circuit protection elements is open or malfunctioning. In some embodiments, the first signal may be a colored light including a red light or other color that indicates an abnormal condition. In some embodiments, the first signal may be a flashing light. In some embodiments, the first signal may be an illuminated light where the light is not illuminated when the one or more circuit protection elements are in the closed or non-malfunctioning state.

At 808, in response to determining the one or more circuit protection elements in the tap box housing is not open or malfunctioning the tap box assembly with separated annunciator emits a second signal. In some embodiments, the second signal may be a green light. In some embodiments the second signal may be a continuously illuminated light, where the first signal at 806 is a flashing light. In some embodiments, the second signal may be a non-illuminated light. In some embodiments, other methods may be used to communicate the first and second signals.

Any of the monitoring circuits described in FIGS. 1-7 may make decisions as described in FIG. 8. The example computer system described in FIG. 9 may be used to implement the decisions described in FIG. 8. In some embodiments, the decisions described in FIG. 8 may be implemented in hardware without a computer system.

Figure 9:
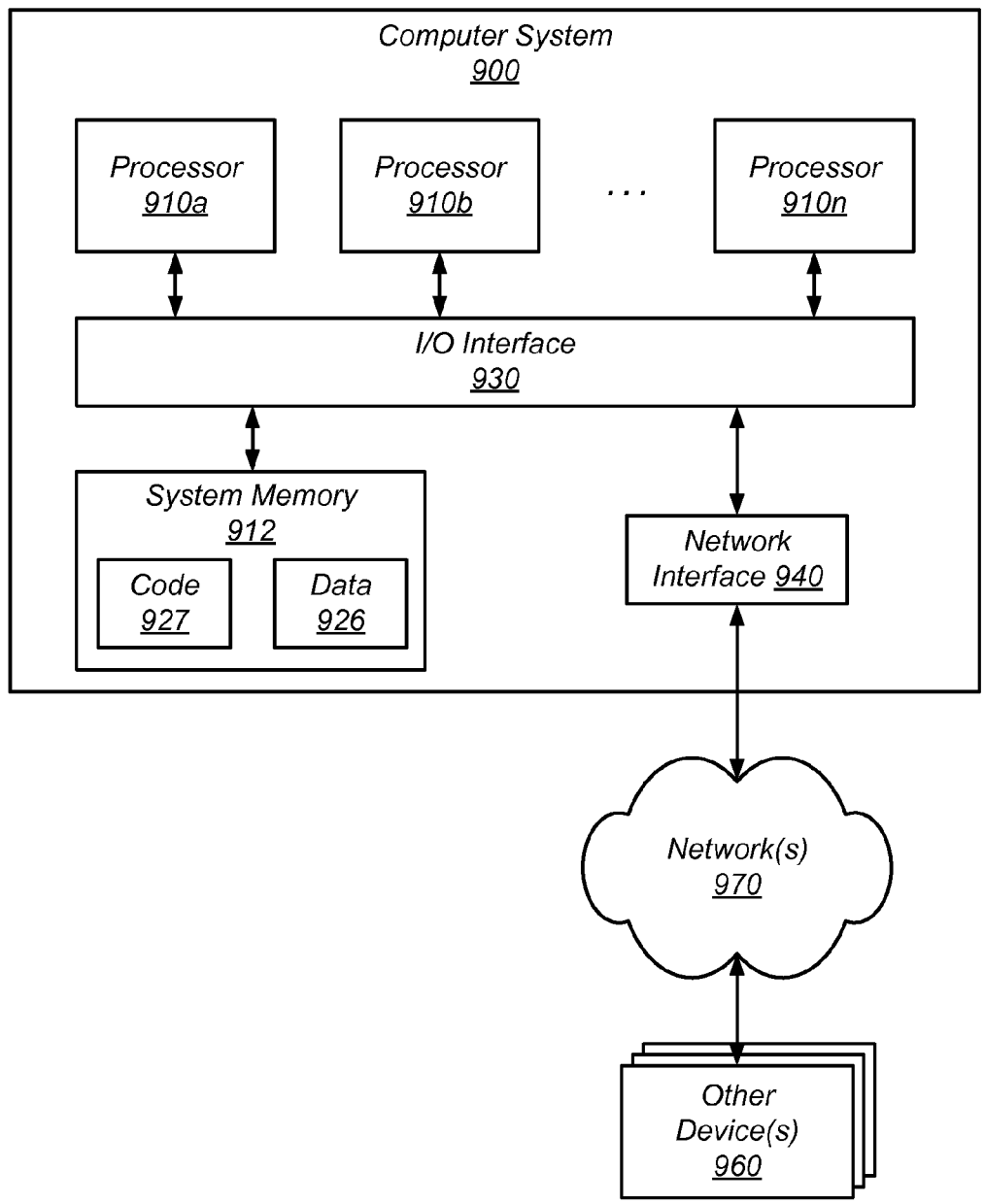
FIG. 9 illustrates a block diagram of an example computer system that may be used in some embodiments.

FIG. 9 is a block diagram illustrating an example computer system that may be used in some embodiments.

In some embodiments, a system that implements a portion or all of one or more of the technologies, including but not limited to a portion or all of the monitoring system, the remote monitoring system interface, and various components of a tap box assembly with separated annunciator as described herein, may include a general-purpose computer system that includes or is configured to access one or more computer system-accessible media, such as computer system 900 illustrated in FIG. 9. In the illustrated embodiment, computer system 900 includes one or more processors 910 coupled to a system memory 920 via an input/output (I/O) interface 930. Computer system 900 further includes a network interface 940 coupled to I/O interface 930.

In various embodiments, computer system 900 may be a uniprocessor system including one processor 910, or a multiprocessor system including several processors 910 (e.g., two, four, eight, or another suitable number). Processors 910 may be any suitable processors capable of executing instructions. For example, in various embodiments, processors 910 may be general-purpose or embedded processors implementing any of a variety of instruction set architectures (ISAs), such as the x86, PowerPC, SPARC, or MIPS ISAs, or any other suitable ISA. In multiprocessor systems, each of processors 1610 may commonly, but not necessarily, implement the same ISA.

System memory 920 may be configured to store instructions and data accessible by processor(s) 910. In various embodiments, system memory 920 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as the monitoring system and the remote monitoring system interface as described herein, are shown stored within system memory 920 as code 927 and data 926.

In some embodiments, I/O interface 930 may be configured to coordinate I/O traffic between processor 910, system memory 920, and any peripheral devices in the device, including network interface 940 or other peripheral interfaces. In some embodiments, I/O interface 930 may perform any necessary protocol, timing or other data transformations to convert data signals from one component (e.g., system memory 920) into a format suitable for use by another component (e.g., processor 910). In some embodiments, I/O interface 930 may include support for devices attached through various types of peripheral buses, such as a variant of the Peripheral Component Interconnect (PCI) bus standard or the Universal Serial Bus (USB) standard, for example. In some embodiments, the function of I/O interface 930 may be split into two or more separate components, such as a north bridge and a south bridge, for example. Also, in some embodiments some or all of the functionality of I/O interface 930, such as an interface to system memory 920, may be incorporated directly into processor 910.

Network interface 940 may be configured to allow data to be exchanged between computer system 900 and other devices 960 attached to a network or networks 950, such as other computer systems or devices as illustrated in FIGS. 1 through 8, for example. In various embodiments, network interface 940 may support communication via any suitable wired or wireless general data networks, such as types of Ethernet network, for example. Additionally, network interface 940 may support communication via telecommunications/telephony networks such as analog voice networks or digital fiber communications networks, via storage area networks such as Fibre Channel SANs, or via any other suitable type of network and/or protocol.

In some embodiments, system memory 920 may be some embodiments of a computer system-accessible medium configured to store program instructions and data for implementing embodiments of power management methods as described above relative to FIGS. 1-8. In other embodiments, program instructions and/or data may be received, sent or stored upon different types of computer-accessible media. Generally speaking, a computer system-accessible medium may include non-transitory storage media or memory media such as magnetic or optical media, e.g., disk or DVD/CD coupled to computer system 900 via I/O interface 930. A non-transitory computer system-accessible storage medium may also include any volatile or non-volatile media such as RAM (e.g. SDRAM, DDR SDRAM, RDRAM, SRAM, etc.), ROM, etc., that may be included in some embodiments of computer system 900 as system memory 920 or another type of memory. Further, a computer-accessible medium may include transmission media or signals such as electrical, electromagnetic, or digital signals, conveyed via a communication medium such as a network and/or a wireless link such as may be implemented via network interface 940.

Various embodiments may further include receiving, sending or storing instructions and/or data implemented in accordance with the foregoing description upon a computer-accessible medium. Generally speaking, a computer system-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center comprising:
   at least two rows of rack computer systems extending on opposite sides of an aisle;
   a busway extending at an elevated position along the aisle, wherein the busway is configured to distribute electrical power from a power source to one or more of the rack computer systems; and
   one or more tap box assemblies coupled to the busway and configured to distribute electrical power from the busway to one or more of the rack computer systems via one or more power cables, wherein each of the one or more tap box assemblies comprises:
   a tap box housing including one or more circuit breakers configured to provide circuit breaker support of the electrical power distributed from the busway to at least one of the power cables, and
   a suspended annunciator electrically coupled to the tap box housing, and suspended at a particular position beneath the tap box housing, by one or more electrical lines, wherein the suspended annunciator is configured to:
      emit a visual signal, indicating a state of the one or more circuit breakers in the tap box housing, at the particular position beneath the tap box housing to enable manual observation of the visual signal from a remote location, at an end of the aisle of computer systems.

2. The data center of claim 1, wherein to emit the visual signal, the suspended annunciator is configured to:
   illuminate a specific colored light of the suspended annunciator to indicate an open state of at least one of the one or more circuit breakers in the tap box housing.

3. The data center of claim 1 wherein:
   the one or more tap box assemblies comprises a plurality of tap box assemblies coupled to the busway, wherein:
      each tap box assembly of the plurality of tap box assemblies is coupled to the busway at separate locations along a length of the busway, and the suspended annunciators of each of the plurality of tap box assemblies are each configured to be suspended at separate particular positions beneath the respective tap box assembly based at least in part upon a proximity of the respective tap box assembly to the end of the aisle, such that the particular position at which a suspended annunciator is suspended from a particular one of the plurality of tap box assemblies that is proximate to the end of the aisle is elevated above another separate position at which a suspended annunciator is suspended from another one of the plurality of tap box assemblies that is distal to the end of the aisle.

4. The data center of claim 1 comprising:
a remote monitoring system communicatively coupled with the one or more tap box assemblies and configured to indicate a state of the one or more circuit breakers mounted in the one or more tap box housings, wherein the suspended annunciator of each tap box assembly is further configured to:
  emit the visual signal independently of the remote monitoring system to provide redundant indication of the state of at least one of the one or more circuit breakers.

5. An apparatus comprising:
a tap box housing configured to distribute electrical power from a coupled power busway to one or more rack computer systems; and
an annunciator, coupled to the tap box housing via at least one electrical line that separates the annunciator from the tap box housing by a separation distance that is configured to:
  emit a visual signal, indicating a state of the tap box housing, at a location separated from the tap box housing by the separation distance to enable remote manual observation of the state of the tap box housing from a remote location.

6. The apparatus of claim 5 wherein:
the busway extends at an elevated position along an aisle of rack computer systems;
the tap box housing is configured to couple to the busway at an elevated position relative to the one or more rack computer systems; and
the annunciator is suspended at a particular position beneath the tap box housing by the at least one electrical line to enable manual observation of the visual signal from a remote location, at an end of the aisle of rack computer systems.

7. The apparatus of claim 5 wherein:
the busway extends in a space beneath a raised floor; and
the annunciator comprises a floor tile comprising:
  one or more lights on an upper surface of the floor tile, and
  one or more electrical connectors on a lower surface of the floor tile,
wherein the one or more electrical connectors of the floor tile are electrically coupled to the one or more lights and configured to couple with one or more electrical connectors of the tap box housing to electrically couple the one or more lights with the tap box housing, based at least in part upon the floor tile being mounted in an open space of the raised floor.

8. The apparatus of claim 5 comprising:
a remote monitoring system communicatively coupled with a plurality of tap box assemblies and configured to indicate a state of each tap box housing of the plurality of tap box assemblies, wherein each tap box assembly comprises an annunciator and the annunciator of each tap box assembly is further configured to:
emit the visual signal independently of the remote monitoring system to provide redundant indication of the state of the tap box housing.

9. The apparatus of claim 8 wherein:
the remote monitoring system is configured to indicate the state of a specific tap box housing based at least in part upon a signal received from a monitoring circuit electrically coupled the specific tap box housing, and
the annunciator coupled to the specific tap box housing is configured to:
provide redundant indication of the state of the specific tap box housing based at least in part upon an independent circuit electrically coupled, independently of the monitoring circuit, to the tap box housing.

10. The apparatus of claim 5 wherein
the annunciator is directly coupled to the tap box housing via at least one electrical line comprising
a rigid member that holds the annunciator in the location separated from the tap box housing by the separation distance.

11. The apparatus of claim 5 wherein
the at least one electrical line is configured to adjust the separation distance between the annunciator and the tap box housing based at least in part on a proximity of the tap box housing to the remote location.

12. The apparatus of claim 5 wherein
the tap box housing comprises one or more circuit breakers and to emit the visual signal indicating the state of the tap box housing, the annunciator is configured to:
  illuminate a specific colored light to indicate an open state of at least one of the one or more circuit breakers of the tap box housing.

13. The apparatus of claim 5 wherein
the tap box housing comprises one or more circuit breakers and to emit the visual signal indicating the state of the tap box housing, the annunciator is configured to:
  flash a light in a particular sequence to indicate an open state of at least one of the one or more circuit breakers of the tap box housing.

14. The apparatus of claim 5 wherein
the at least one electrical line that couples the annunciator to the tap box housing further comprises one or more electrical quick release connectors configured to:
couple the at least one electrical line to the tap box housing via one or more magnets; and
decouple the at least one electrical line from the tap box housing without damaging the electrical line, the tap box housing, or the one or more electrical quick release connectors based at least in part on a tensile force exerted on the at least one electrical line.

15. A method comprising:
receiving a tap box configured to:
  couple to a busway distributing electrical power, and
  distribute electrical power from the busway to one or more electrical loads via a power cable connection;
receiving an annunciator line comprising an annunciator on one end of the annunciator line and one or more electrical connectors on an opposite end of the annunciator line; and
configuring the annunciator to emit a visual signal indicating a state of the tap box at a location separated from the tap box by a separation distance to enable remote manual observation of the state of the tap box from a remote location, wherein the configuring comprises:
  electrically coupling the one or more electrical connectors of the annunciator line to one or more monitoring circuits of the tap box; and
  coupling the tap box to the busway, such that the visual signal is manually observable from the remote location.

16. The method of claim 15 wherein:
the busway extends at an elevated position along an aisle of rack computer systems;
the tap box is configured to couple to the busway at an elevated position relative to the one or more rack computer systems; and
coupling the tap box coupled to the annunciator line to the elevated busway comprises:
  suspending the annunciator at a particular position beneath the tap box by the annunciator line to enable manual observation of the visual signal from a remote location, at an end of an aisle of rack computer systems.

17. The method of claim 15 wherein:
the busway extends in a space beneath a raised floor;
the annunciator comprises a floor tile comprising:
  one or more lights on an upper surface of the floor tile, and
  one or more electrical connectors on a lower side of the floor tile electrically coupled to the one or more lights,
  wherein the one or more connectors of the floor tile are configured to couple with one or more electrical connectors of the tap box to electrically couple the one or more lights with the tap box; and
coupling the tap box coupled to the annunciator line to the underfloor busway comprises:
  mounting the floor tile in an open space of the raised floor such that the one or more connectors of the floor tile electrically couple with the one or more electrical connectors of the tap box.

18. The method of claim 15 wherein:
the annunciator line is configured to adjust the separation distance between the annunciator and the tap box based at least in part on a physical proximity of the tap box to the remote location; and
coupling the tap box to the busway further comprises:
  coupling a plurality of tap boxes to the busway at separate locations along a length of the busway extending along an aisle of rack computer systems, and
  adjusting the separation distance between the annunciator and the tap box based at least in part on the physical proximity of the tap box to the remote location.

19. The method of claim 15 wherein the annunciator line comprises:
  a rigid member that holds the annunciator in the location separated from the tap box by the separation distance.

20. The method of claim 15 wherein the tap box comprises one or more circuit breakers and to emit the visual signal indicating a state of the tap box, the annunciator is configured to:
  illuminate a specific colored light to indicate an open state of at least one of the one or more circuit breakers.

21. The method of claim 15 wherein the tap box comprises one or more circuit breakers and to emit the visual signal indicating a state of the tap box, the annunciator is configured to:
  flash a light in a particular sequence to indicate an open state of at least one of the one or more circuit breakers.

* * * * *